US008571855B2

(12) United States Patent
Christoph (10) Patent No.: US 8,571,855 B2
(45) Date of Patent: *Oct. 29, 2013

(54) AUDIO ENHANCEMENT SYSTEM

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 825 days.

This patent is subject to a terminal disclaimer.

(21) Appl. No.: 11/185,534

(22) Filed: Jul. 20, 2005

(65) Prior Publication Data

US 2006/0025994 A1 Feb. 2, 2006

(30) Foreign Application Priority Data

Jul. 20, 2004 (EP) .................................. 04017143

(51) Int. Cl.
*G10L 21/02* (2013.01)
*A61F 11/06* (2006.01)
*H04B 15/00* (2006.01)

(52) U.S. Cl.
USPC ......... 704/228; 704/226; 381/71.1; 381/94.1; 381/94.2

(58) Field of Classification Search
USPC .................. 704/229; 381/71.1, 94.1, 94.2
See application file for complete search history.

(56) References Cited

U.S. PATENT DOCUMENTS

| | | | |
|---|---|---|---|
| 3,714,622 A | 1/1973 | Wilhelmsen | |
| 3,934,084 A | 1/1976 | Munson et al. | |
| 3,934,085 A | 1/1976 | Munson et al. | |
| 4,025,723 A | 5/1977 | Blackledge | |
| 4,223,181 A | 9/1980 | Simeau | |
| 4,247,955 A | 1/1981 | Wiedemann | |
| 4,254,303 A | 3/1981 | Takizawa | |

(Continued)

FOREIGN PATENT DOCUMENTS

| | | | | |
|---|---|---|---|---|
| DE | 3220758 | 12/1983 | ........................... | 3/20 |
| DE | 3320751 | 12/1984 | ........................... | 3/20 |

(Continued)

OTHER PUBLICATIONS

Jul 2002 M. Raad, A. Mertins and I. Burnett: Audio Coding Based on the Modulated Lapped Transform (MLT) and Set Partitioning in Hierarchical Trees Proc. 6th World Multiconference on Systemics Cybernetics and Informatics (SCI 2002), 3:303-306, Jul. 2002, Orlando FL USA.*

(Continued)

*Primary Examiner* — Douglas Godbold
*Assistant Examiner* — Michael Ortiz Sanchez
(74) *Attorney, Agent, or Firm* — O'Shea Getz P.C.

(57) ABSTRACT

A system and method for enhancing the sound signal produced by an audio system in a listening environment by compensating for ambient sound in the listening environment, comprises producing an audio sound in the time domain from an electrical sound signal in the time domain. The electrical sound signal in the time domain is transformed into an electrical sound signal in the frequency domain and the electrical sound signal in the frequency domain is retransformed into an audio sound in the time domain. The total sound level in the environment is measured and a signal representative thereof is generated. The audio sound signal and the total sound signal are processed to extract a signal representing the ambient sound level within the environment, and equalization is performed in the frequency domain to adjust the output from the audio sound signal to compensate for the ambient noise level.

33 Claims, 5 Drawing Sheets

(56) References Cited

U.S. PATENT DOCUMENTS

| | | |
|---|---|---|
| 4,297,527 A | 10/1981 | Pate |
| 4,306,115 A | 12/1981 | Humphrey |
| 4,380,824 A | 4/1983 | Inoue |
| 4,406,923 A | 9/1983 | Burne, III et al. |
| 4,409,435 A | 10/1983 | Ono |
| 4,438,526 A | 3/1984 | Thomalla |
| 4,461,025 A | 7/1984 | Franklin |
| 4,476,571 A | 10/1984 | Tokumo et al. |
| 4,479,237 A | 10/1984 | Sugasawa |
| 4,553,258 A | 11/1985 | Chainer et al. |
| 4,590,593 A | 5/1986 | Rodney |
| 4,598,417 A | 7/1986 | Deno |
| 4,628,526 A | 12/1986 | Germer |
| 4,636,586 A | 1/1987 | Schiff |
| 4,641,344 A | 2/1987 | Kasai et al. |
| 4,649,505 A | 3/1987 | Zinser, Jr. et al. |
| 4,672,674 A | 6/1987 | Clough et al. |
| 4,677,389 A | 6/1987 | Op de Beek et al. |
| 4,696,030 A | 9/1987 | Egozi |
| 4,696,044 A | 9/1987 | Waller, Jr. |
| 4,718,099 A | 1/1988 | Hotvet |
| 4,723,294 A | 2/1988 | Taguchi |
| 4,731,850 A | 3/1988 | Levitt et al. |
| 4,751,739 A | 6/1988 | Serikawa et al. |
| 4,769,847 A | 9/1988 | Taguchi |
| 4,823,391 A | 4/1989 | Schwartz |
| 4,827,458 A | 5/1989 | D'Alayer de Costemore D'Arc |
| 4,837,834 A | 6/1989 | Allie |
| 4,852,175 A | 7/1989 | Kates |
| 4,864,246 A | 9/1989 | Kato et al. |
| 4,887,299 A | 12/1989 | Cummins et al. |
| 4,891,605 A | 1/1990 | Tirkel |
| 4,953,221 A | 8/1990 | Holly et al. |
| 4,956,867 A | 9/1990 | Zurek et al. |
| 4,965,834 A | 10/1990 | Miller |
| 5,018,202 A | 5/1991 | Takahashi et al. |
| 5,018,205 A | 5/1991 | Takagi et al. |
| 5,034,984 A | 7/1991 | Bose |
| 5,048,091 A | 9/1991 | Sato et al. |
| 5,068,834 A | 11/1991 | Fromont |
| 5,077,799 A | 12/1991 | Cotton |
| 5,081,682 A | 1/1992 | Kato et al. |
| 5,089,997 A | 2/1992 | Pecukonis |
| 5,107,539 A | 4/1992 | Kato et al. |
| 5,117,401 A | 5/1992 | Feintuch |
| 5,126,681 A | 6/1992 | Ziegler, Jr. et al. |
| 5,131,047 A | 7/1992 | Hashimoto et al. |
| 5,146,505 A | 9/1992 | Pfaff et al. |
| 5,146,507 A | 9/1992 | Satoh et al. |
| 5,204,971 A | 4/1993 | Takahashi et al. |
| 5,208,866 A | 5/1993 | Kato et al. |
| 5,226,016 A | 7/1993 | Christman |
| 5,243,661 A | 9/1993 | Ohkubo et al. |
| 5,255,324 A | 10/1993 | Brewer et al. |
| 5,267,322 A | 11/1993 | Smith et al. |
| 5,291,558 A | 3/1994 | Ross |
| 5,293,425 A | 3/1994 | Oppenheim et al. |
| 5,311,446 A | 5/1994 | Ross et al. |
| 5,325,437 A | 6/1994 | Doi et al. |
| 5,410,605 A | 4/1995 | Sawada et al. |
| 5,416,846 A | 5/1995 | Tamura et al. |
| 5,434,922 A | 7/1995 | Miller et al. ................... 381/57 |
| 5,434,926 A | 7/1995 | Watanabe et al. |
| 5,450,494 A | 9/1995 | Okubo et al. ................... 381/57 |
| 5,485,523 A | 1/1996 | Tamamura et al. |
| 5,530,761 A * | 6/1996 | d'Alayer de Costemore d'Arc ................... 381/57 |
| 5,539,832 A | 7/1996 | Weinstein et al. |
| 5,615,270 A | 3/1997 | Miller et al. |
| 5,635,903 A * | 6/1997 | Koike et al. ................... 340/441 |
| 5,666,426 A | 9/1997 | Helms |
| 5,699,424 A | 12/1997 | Hirano |
| 5,757,937 A | 5/1998 | Itoh et al. |
| 5,774,565 A * | 6/1998 | Benning et al. ................... 381/83 |
| 5,778,073 A * | 7/1998 | Busching et al. ................... 380/33 |
| 5,796,847 A | 8/1998 | Kaihotsu et al. |
| 5,872,852 A | 2/1999 | Dougherty |
| 5,884,992 A | 3/1999 | Taylor et al. |
| 6,061,455 A | 5/2000 | Hadley et al. |
| 6,072,881 A | 6/2000 | Linder |
| 6,078,670 A | 6/2000 | Beyer |
| 6,098,036 A * | 8/2000 | Zinser, Jr. et al. ................... 704/219 |
| 6,163,608 A * | 12/2000 | Romesburg et al. ..... 379/406.01 |
| 6,351,731 B1* | 2/2002 | Anderson et al. ................... 704/233 |
| 6,370,254 B1 | 4/2002 | Gore et al. |
| 6,415,253 B1* | 7/2002 | Johnson ................... 704/210 |
| 6,487,529 B1* | 11/2002 | Miet ................... 704/233 |
| 6,529,605 B1 | 3/2003 | Christoph ................... 381/56 |
| 6,718,036 B1 | 4/2004 | Van Schyndel et al. |
| 6,868,162 B1 | 3/2005 | Jubien et al. |
| 7,117,145 B1* | 10/2006 | Venkatesh et al. ................... 704/200 |
| 7,171,003 B1* | 1/2007 | Venkatesh et al. ................... 381/66 |
| 7,254,242 B2 | 8/2007 | Ise et al. |
| 7,302,062 B2 | 11/2007 | Christoph |
| 2001/0055400 A1* | 12/2001 | Lubbe et al. ................... 381/106 |
| 2003/0053639 A1 | 3/2003 | Beaucoup et al. ................... 381/92 |
| 2003/0128851 A1* | 7/2003 | Furuta ................... 381/94.2 |
| 2003/0215013 A1* | 11/2003 | Budnikov ................... 375/240.16 |
| 2004/0057586 A1 | 3/2004 | Licht ................... 381/94.7 |
| 2004/0076302 A1 | 4/2004 | Christoph |
| 2004/0125962 A1 | 7/2004 | Christoph |
| 2005/0008170 A1 | 1/2005 | Pfaffinger et al. |
| 2005/0013443 A1 | 1/2005 | Marumoto et al. |
| 2005/0015252 A1 | 1/2005 | Marumoto |
| 2005/0058301 A1 | 3/2005 | Brown |
| 2005/0075870 A1* | 4/2005 | Chamberlain ................... 704/226 |
| 2006/0262938 A1* | 11/2006 | Gauger et al. ................... 381/56 |

FOREIGN PATENT DOCUMENTS

| | | | |
|---|---|---|---|
| DE | 3322055 | 12/1984 | ................... 3/20 |
| DE | 3338413 | 5/1985 | |
| DE | 4204385 | 8/1993 | |
| DE | 19736699 | 2/1999 | |
| EP | 0 017 519 | 10/1980 | ................... 11/30 |
| EP | 0 319 777 | 6/1989 | ................... 3/32 |
| EP | 0 623 995 | 11/1994 | ................... 3/32 |
| GB | 2 013 051 | 8/1979 | ................... 3/20 |
| GB | 2 257 317 | 1/1993 | ................... 3/32 |
| JP | 61108212 | 5/1986 | |
| JP | 62092607 | 4/1987 | ................... 3/32 |
| JP | 04047705 | 2/1992 | ................... 5/16 |
| JP | 04070106 | 3/1992 | ................... 3/32 |
| JP | 4094204 | 3/1992 | ................... 3/32 |
| JP | 04302204 | 10/1992 | ................... 3/32 |
| JP | 04365210 | 12/1992 | ................... 3/32 |
| JP | 05037270 | 2/1993 | ................... 3/32 |
| JP | 05220361 | 8/1993 | ................... 71/68 |
| JP | 05259779 | 10/1993 | ................... 3/32 |
| JP | 06069742 | 3/1994 | ................... 3/32 |
| JP | 09-116469 | 5/1997 | |
| JP | 9116361 | 5/1997 | ................... 3/32 |
| JP | 10-206180 | 8/1998 | |
| JP | 11225030 | 8/1999 | ................... 3/32 |
| JP | 2001-195085 | 7/2001 | |
| JP | 2005-086284 | 3/2005 | |
| WO | WO 00/04636 | 1/2000 | ................... 9/18 |
| WO | WO 2004/010191 | 1/2004 | ................... 6/43 |

OTHER PUBLICATIONS

M. Raad, A. Mertins, and R. Burnett, "Audio coding based on the modulated lapped transform (MLT) and set partitioning in hierarchical trees," in Prof. 6th World Multiconference on Systemics, Cybernetics and Informatics, Orlando, USA, Jul. 2002, pp. 303-306.*

ISO/IEC JTCI/SC29/WG11 MPEG, IS11172-73, "Coding of Moving Pictures and Associated Audio," International Organisation for Standardisation, Nov. 11, 1994, pp. 1-104.

Johnston, J.D.: "Perceptual Transform Coding of Wideband Stereo Signals", Proc. ICASSP'99, pp. 2524-2527.

Johnston, J.D.: "Transform Coding of Audio Signals Using Perceptual Noise Criteria", IEEE Journal on Selected Areas in Communications 6, pp. 314-323.

(56) References Cited

OTHER PUBLICATIONS

Zwicker et al.: "Psychoacoustics, Facts and Models", Springer Series in Information Sciences, $2^{nd}$ edition, pp. 61-110.
Weiss et al.: "On Adaptive Filtering in Oversampled Subbands", ISBN Mar. 8265/45/66/4, 1998, pp. 139-166.
Härmä, Aki: "Linear Predictive Coding with Modified Filter Structures".
Härmä, Aki: "Evaluation of a Warped Linear Predictive Coding Scheme," Laboratory of Acoustics and Audio Signal Processing.
Härmä et al.: "A Comparison of Warped and Conventional Linear Predictive Coding".
Härmä et al.: "Frequency-Warped Signal Processing for Audio Applications," Journal of the Audio Engineering Society, Audio Engineering Society, vol. 48, No. 11, Nov. 2000.
Dobson, Richard: "A Dictionary of Electronic and Computer Music Technology", pp. 158-185, Oxford University Press 1992.

* cited by examiner

AUDIO ENHANCEMENT SYSTEM

CLAIM OF PRIORITY

This application claims priority from European patent application EP 04 017 143.1, filed Jul. 20, 2004, which is hereby incorporated by reference.

FIELD OF THE INVENTION

This invention relates to a system and method for improving the sound reproduced by audio systems in a listening environment such as a vehicle and, in particular, to a system and method which compensates for noise outside the audio system.

RELATED ART

When music or speech is reproduced, for example, in a vehicle, the signal is corrupted by external acoustic noise present in the vehicle. This noise may result from and is dependent upon vehicle speed, road condition, weather and condition of the vehicle. The presence of such noise results in a situation where soft sounds of interest are hidden, the perceived loudness is reduced and the intelligibility of the signal is decreased. The vehicle's driver and/or passengers may compensate for increased external noise by increasing the volume of the audio system. However, when the vehicle speed decreases or another source of external noise is alleviated, the volume of the audio system will be too high, requiring the user to reduce it. To overcome this, U.S. Pat. Nos. 5,434,922 and 6,529,605 propose an enhanced dynamic volume control (DVC) system which extracts the noise signal from a signal provided by a sensor (e.g., a sensing microphone) in the listening environment and calculates a control signal therefrom. This control signal is used to control the volume and/or dynamics of the desired signal (i.e., music).

A DVC system extracts the noise signal from mixed signals derived from a sensor (e.g., a microphone). The mixed signals comprise music components (i.e., the desired signal), voice components and noise components. The noise component is intended to be used solely for obtaining the control signal for the volume or dynamics of the desired signal. The other components are not wanted to have any effect on the derivation of the control signal as otherwise the system would respond to voice signals or control itself through the music, which would end in a so-called gain chase situation (i.e., direct feedback). Such a gain chase situation may lead to instability in the entire audio system.

The music signal is extracted from the sensor signal using an adaptive filter. The voice signal left in the remaining signal mixture is then masked out using a "voice activity detector" (VAD). The VAD operates continuously in the time domain—i.e., in a broadband manner—and is implemented by an averaging unit with permanently configured increments and decrements. With other words, as long as the input signal is larger than the output signal, the VAD increases its output signal by a fixed increment, or reduces it by a fixed decrement whenever the input signal is less than the output signal from the VAD. In this way, the VAD utilizes the different stationary properties of the voice and noise signals. The noise signal is strongly (broadband) smoothed so that the VAD output signal (i.e., the control signal), even if somewhat delayed, reaches a stationary final value, which approximately corresponds to the average power of the noise signal in the sensor signal. Depending on the configured volume or selected equalizing, which mainly refers in this instance to the bass setting, the music signal more or less penetrates the noise signal—i.e., the louder the desired signal (music signal) is played or the higher the bass controller is set, the greater the share of the music signal that passes unfiltered through the adaptive filter. This can lead to the known gain chase situation described above, which it is imperative to prevent.

It has been found that the adaptive filter works better (i.e., permits less of the desired signal to pass through it) if the signals have a narrower bandwidth. For this reason, the DVC system mostly works with strongly undersampled signals, which on the one hand reduces the implementation complexity, but on the other hand leads to a control signal derived solely from the low-frequency noise component and then applied in a broadband manner to control the volume or dynamics. Since low-frequency noise signals dominate in vehicles—the field for which most of the DVC system are primarily designed—the spectral limitation described above can only actually be considered in this context. Nonetheless, the solution is not ideal and may lead to overlapping effects in certain circumstances, which is why a broadband solution is preferable. Although the risk of gain chase is reduced through limiting the bandwidth, it is not fully eliminated.

One way of avoiding gain chase is to upward-limit the control signal in accordance with the existing power of the desired signal that is implemented in common systems in the form of an anti-gain chase function. This function permits the control signal, provided the desired signal is below a specific minimum threshold value, to pass through the filter without being changed, but limits it to a maximum value specified by another function if the power of the desired signal rises above the threshold, and blocks further control once the desired signal has exceeded a maximum threshold—i.e., the control signal is then replaced by zero. The control signal modified in this way can then be used to alter the volume and/or dynamics of the desired signal using a compressor. However, the control signal is, nevertheless, fully dependent on the mean power of the currently existing noise signal but does not consider its spectral distribution or coloring.

In this regard, systems known as "dynamic equalizer control" (DEC) systems are considered successors to DVC systems. However, one aspect that hinders the transition from DVC to DEC systems is the limited bandwidth with which DVC systems work. The reason why the bandwidth is limited is primarily to reduce the risk of gain chase and to reduce the implementation work.

Therefore, there is a need for an improved system and method that automatically compensate for the noise level in a listening environment.

SUMMARY OF THE INVENTION

A dynamic equalizer control (DEC) system digitally processes electrical audio signals to compensate for the intrusion of acoustic noise into a listening area. The system may be used with any audio system and any listening environment. For purposes of simplicity, it is referred to the output of the audio system as the music signal and the listening environment described herein is a vehicle cabin. It is understood that the invention is not so limited, as it may be used in other rooms and listening environments, as well.

The DEC system comprises an audio system that produces an electrical sound signal in the time domain and generates a sound output from the electrical sound signal. The audio system comprises a time-to-frequency transformation responsive to the electrical sound signal in the time domain for generating an electrical sound signal in the frequency domain. The audio system further comprising a frequencyto-time transform responsive to the electrical sound signal in the frequency domain for generating a re-transformed electrical sound signal in the time domain for generating the sound output. A sensor senses the sound representative of the total sound level in the environment, wherein the total sound level comprises both the sound output from the audio system and the ambient noise within the environment. An extraction circuit responsive to the total sound signal and to the electrical sound signal extracts an ambient noise signal representative of the ambient noise in the environment from the total sound signal. A controller responsive to the ambient noise signal and the electrical sound signal in the frequency domain for equalizes and adjusts in the frequency domain the sound output of the audio system to compensate for the ambient noise level.

A method in accordance with the present invention comprises producing an audio sound from an electrical sound signal in the time domain. The electrical sound signal in the time domain is transformed into electrical sound signal in the frequency domain and the electrical sound signal in the frequency domain is retransformed into audio sound in the time domain. The method further comprises measuring the total sound level in the environment and generating a signal representative thereof. In addition the audio sound signal and the total sound signal are processed to extract a signal representing the ambient sound level within the environment. Equalizing is performed in the frequency domain to adjust the output from the audio sound signal to compensate for the ambient noise level.

The DEC system measures the loudness of the music and noise in a vehicle and determines the effect of the noise on the perceived loudness of the music. The system then boosts the level of the music to compensate for the masking effect. The loudness of the music is determined by monitoring the music signal voltage coming from the music source. The sound in the vehicle includes both music and noise as measured by the microphone. The microphone signal is converted to a digital representation, and the system uses digital processing to remove the music signal. The system includes hardware and appropriate software to shape the spectrum of the music and noise signal to mimic human hearing.

An aspect of the present invention is that basic parts of the DEC system are operated in the frequency domain. The invention provides for a system that adjusts not only gain but equalization in response to the noise. The perception of high frequencies is not greatly affected by road noise, but bass frequencies are strongly masked. The DEC system controls the desired signal (e.g., music signal) according to the spectral distribution of the noise signal, and in doing so psychoacoustic aspects may also be considered when configuring the equalization.

As can be seen, even though it is more complex to implement the DEC system in the spectral domain than in the time domain, the processing nevertheless benefits from greater flexibility and options, which in the final outcome represents superior quality of the system.

The other systems, methods, features and advantages of the invention will be or will become, apparent to one with skill in the art upon examination of the following figures and detailed description. It is intended that all such additional systems, methods, features and advantages be included within this description, be within the scope of the invention, and be protected by the following claims.

DESCRIPTION OF THE DRAWINGS

The invention can be better understood with reference to the following drawings and description. The components in the figures are not necessarily to scale, emphasis instead being placed upon illustrating the principles of the invention. Moreover, in the figures, like reference numerals designate corresponding parts throughout the different views.

DETAILED DESCRIPTION

Analysis shows that the main reason why adaptive filters fail in broadband applications in the time domain is to be found in the wide dynamic range of the input signals. If the broadband input signals in the time domain are transformed into the frequency domains in such a way that all frequency are processed, the music signal can be removed from the sensor signal in a broadband manner.

Figure 1:
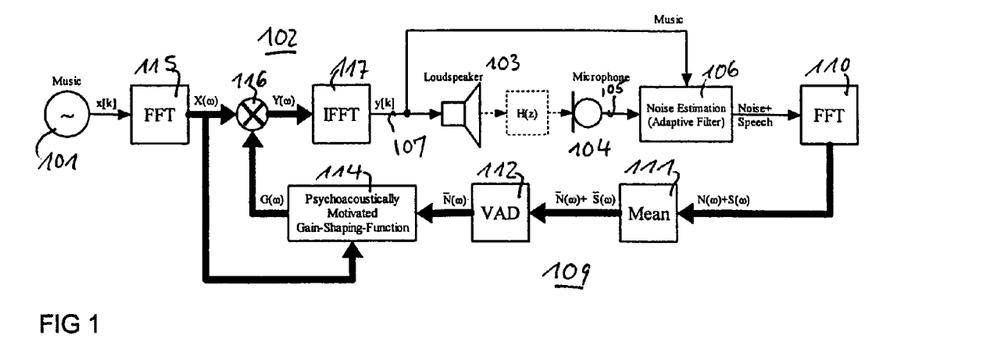
FIG. 1 is a block diagram of a DEC system.

FIG. 1 illustrates a DEC system essentially operated in the frequency domain. In the system of FIG. 1, the voice signal component in the microphone signal is suppressed in the frequency domain. A signal source 101 supplies a desired signal, such as for example a music signal x[k] from CD player, radio, cassette player or the like. The signal x[k] is fed into a spectral dynamic equalization control (DEC) unit 102 operated in the frequency domain to an equalized signal y[k] on a line 107 to a loudspeaker 103. The loudspeaker 103 generates an acoustic signal, transferred to a microphone 104 wherein the transferal can be described by a transfer function H(z). The signal from the microphone 104 is supplied to an adaptive filter 106 operated in the time domain for estimating the noise in the microphone signal. The microphone provides a signal on a line 105 representing the total sound level in the environment, wherein the total sound level comprises both the sound output from the loudspeaker 103 and the ambient noise within the environment (e.g., the loudspeaker-room-microphone (LRM) system).

The signal y[k] on the line 107 from the DEC unit 102 is used as a reference signal for the adaptive filter 106. The signal output by the adaptive filter 106 is transferred via a spectral voice suppression unit 109 and a psycho-acoustic gain shaping unit 114 operated in the frequency domain to the DEC unit 102. The voice suppression unit 109 comprises a Fast-Fourier transform (FFT) unit 110 for transforming signals from the time domain into signals in the frequency domain. In a mean calculation unit 111 the signals in the frequency domain are averaged and supplied to a voice activity decoder (VAD) 112 for detecting and suppressing spectral voice signal components in the signals in the frequency domain from the FFT unit 110. Different kinds of voice activity detectors are known, for example, from U.S. 20030053639A1.

The signals from the VAD 112 are supplied to the psychoacoustic gain shaping unit 114 receiving signals from and transmitting signals to the spectral DEC unit 102. The spectral DEC unit 102 comprises a Fast-Fourier transformation (FFT) unit 115 which receives the signal x[k] and transforms it into a spectral signal $X(\omega)$. The signal $X(\omega)$ is supplied to the psycho-acoustic gain shaping unit 114 and to a multiplier 116, which also receives a signal $G(\omega)$ representing spectral gain factors from the psycho-acoustic gain shaping unit 114. The multiplier 116 provides a spectral signal $Y(\omega)$ which is fed into an inverse Fast-Fourier transformation (IFFT) unit 117 and transformed into the signal y[k].

In one embodiment, the application of linear predictive coding (LPC) in the frequency domain is very favourable. As linear predictive coding (LPC) analysis is performed in the frequency domain the equalizer gain factors are estimated in the spectral range and are dependent on the current noise signal only. Here not only can the voice signal be computationally removed from the microphone signal, but also psycho-acoustic properties can be used in a relatively simple manner when calculating the gain factors. The transition from the time to the spectral range can take place either using a Fast Fourier Transformation (FFT) or a warped Fast Fourier Transformation (WFFT), or with a psycho-acoustically motivated filter bank with frequency bands of different widths (e.g., based on a bark scale).

Linear predictive coding is one of a family of analysis/resynthesis techniques developed for speech encoding, transmission and reception and is still the most widely used technique for computer-generated speech. LPC attempts to estimate the spectrum of a sound in terms of the filter coefficients that would be needed to synthesise that sound when applied to an excitation source, which may be either noise (for unvoiced sounds), or a band-limited pulse wave in which all the harmonics are of equal amplitude. In a synthesis application, both the excitation waveform and the filter coefficients can be modified (in both the frequency and time domains) to create related variants of the original sound. (see Richard Dobson, A Dictionary of Electronic and Computer Music Technology, Oxford University Press, 1992)

When calculating the gain factors ($G(\propto)$), the spectrum of the desired signal ($X(\omega)$) can be used along with the estimated noise spectrum ($N(\omega)$). In doing so, masking effects, for example, can be considered in addition to a detailed reproduction of the ear characteristics, whose mean value as manifested in an A-filter as used in time range solutions. The differentiating frequency resolution property of the human ear can be considered as early as during the transition from the time range to the spectral range—e.g., using a psycho-acoustic motivated filter bank or a WFFT, but this is not mandatory. A conventional FFT may also be used and the spectral lines then processed in groups as well as a variable tap profile for subband adaptive filtering (see, for example, F. Weiss, R. W. Stunt, On Adaptive Filtering in Oversampled Subbands, 1998, ISBN 3/8265/45/66/4).

In the system of FIG. 1, the music signal is conventionally extracted from the microphone signal using an adaptive filter operated in the time domain. The consequence of this approach is that only the superimposition of the necessary noise signal with the noisy speech signal remains in ideal cases. The noise effects of the speech signal are then suppressed in the spectral domain using a voice activity detection mechanism so that in ideal cases the noise signal remains (as required). The spectral shape of this noise signal is not affected to any major extent, a factor that is necessary in order to then, together with the source signal, be able to compute the equalizer filter. Psycho-acoustic characteristics can be used in a relatively simple manner—this aspect will be considered in greater detail later.

A further distinguishing factor of a spectral DEC system as shown in FIG. 1, is that the FIR filtering—i.e., the weighting of the desired signal (music signal) with the equalizer filter using the fast convolution, is also carried out directly in the spectral domain. Depending on the length of the FIR filter or the FFT (Fast Fourier Transformation), this solution can considerably shorten the computing time. A general rule of thumb is that FIR filters with a length of about 30 taps can be implemented with greater computing efficiency using the fast convolution than in the time domain. However, the fast convolution can significantly increase memory requirements under certain circumstances. This is not just a problem associated with the fast convolution; it also occurs with every form of signal processing in the spectral domain. Either an FFT or warped FFT (WFFT) or a psycho-acoustic-motivated filter bank with frequency bands of different widths can be used for the transition from the time to the spectral domain. The frequency resolution characteristics of the human ear may already be considered here. However, as already mentioned, a conventional FFT also can be used. In this case, the spectral lines must be subsequently processed as groups in the spectral domain in order to account for the frequency resolution characteristics of the human ear.

Figure 2:
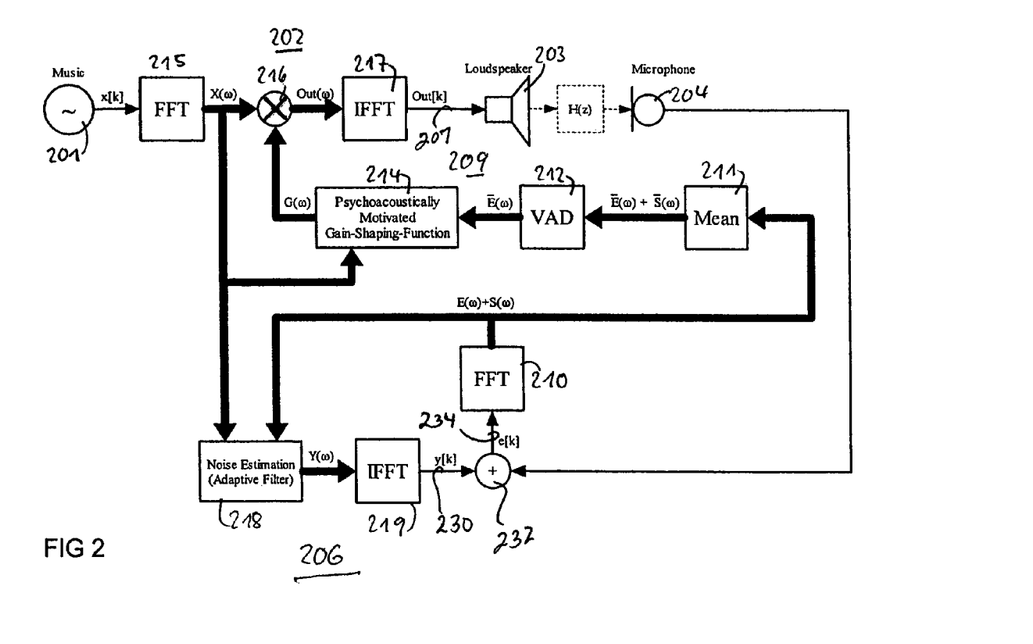
FIG. 2 is an alternative embodiment of a DEC system.

An alternative implementation of a DEC system in the spectral domain is illustrated in FIG. 2. It differs from the one shown in FIG. 1 in that the adaptive filter is also implemented in the spectral domain. There are different ways of implementing an adaptive filter in the spectral domain, but only the best-known solution, the so-called overlap save FDAF (Frequency Domain Adaptive Filter), is referred to in this alternative system illustrated in FIG. 2.

In the system of FIG. 2, a signal source 201 supplies a desired signal, for example a music signal x[k] from a CD player, radio, cassette player or the like, to a spectral dynamic equalization control (DEC) unit 202 operated in the frequency domain and providing an equalized signal OUT[k] on a line 207 to a loudspeaker 203. The loudspeaker 203 generates an acoustic signal that is transferred to a microphone 204 wherein the transferal can be described by a transfer function H(z). The signal from the microphone 204 is supplied via a spectral voice suppression unit 209 and a psycho-acoustic gain shaping unit 214 (both operated in the frequency domain) to the DEC unit 202.

The voice suppression unit 209 comprises a Fast-Fourier transform (FFT) unit 210 for transforming signals from the time domain into the frequency domain. In a mean calculation unit 211 the signals in the frequency domain from the FFT unit 210 are averaged and supplied to a voice activity decoder (VAD) 212 for detecting spectral voice signal components in the signals in the frequency domain from the FFT unit 210.

The signals from the VAD 212 are supplied to the psycho-acoustic gain shaping unit 214 receiving signals from and transmitting signals to the spectral DEC unit 202. The spectral DEC unit 202 comprises a Fast-Fourier transformation (FFT) unit 215 which receives the signal x[k] and transforms it into a spectral signal $X(\omega)$. The signal $X(\omega)$ is supplied to the psycho-acoustic gain shaping unit 214 and to a multiplier 216 which also receives a signal $G(\omega)$ representing spectral gain factors from the psycho-acoustic gain shaping unit 214. The multiplier 216 generates a spectral signal $OUT(\omega)$ the signal $OUT(\omega)$ is fed into an inverse Fast-Fourier transformation (IFFT) unit 217 and transformed to provide the signal OUT[k].

In FIG. 2, instead of the adaptive filter for estimating the noise in the microphone signal operated in the time domain, an adaptive filter 206 operated in the frequency domain receives the microphone signal representing the total sound level in the environment, wherein the total sound level comprises both the sound output from the loudspeaker 203 and the ambient noise within the environment (LRM system). The signal X(ω) is used as a reference signal for the adaptive filter 206. The signal output by the adaptive filter 206 is transferred to an inverse Fast-Fourier transformation (IFFT) unit 219 and transformed into the signal y[k]. A difference unit 232 computes the difference between the signal on the line 230 and the output signal from the microphone to generate an error signal on a line 234 indicative of the difference.

Figure 3:
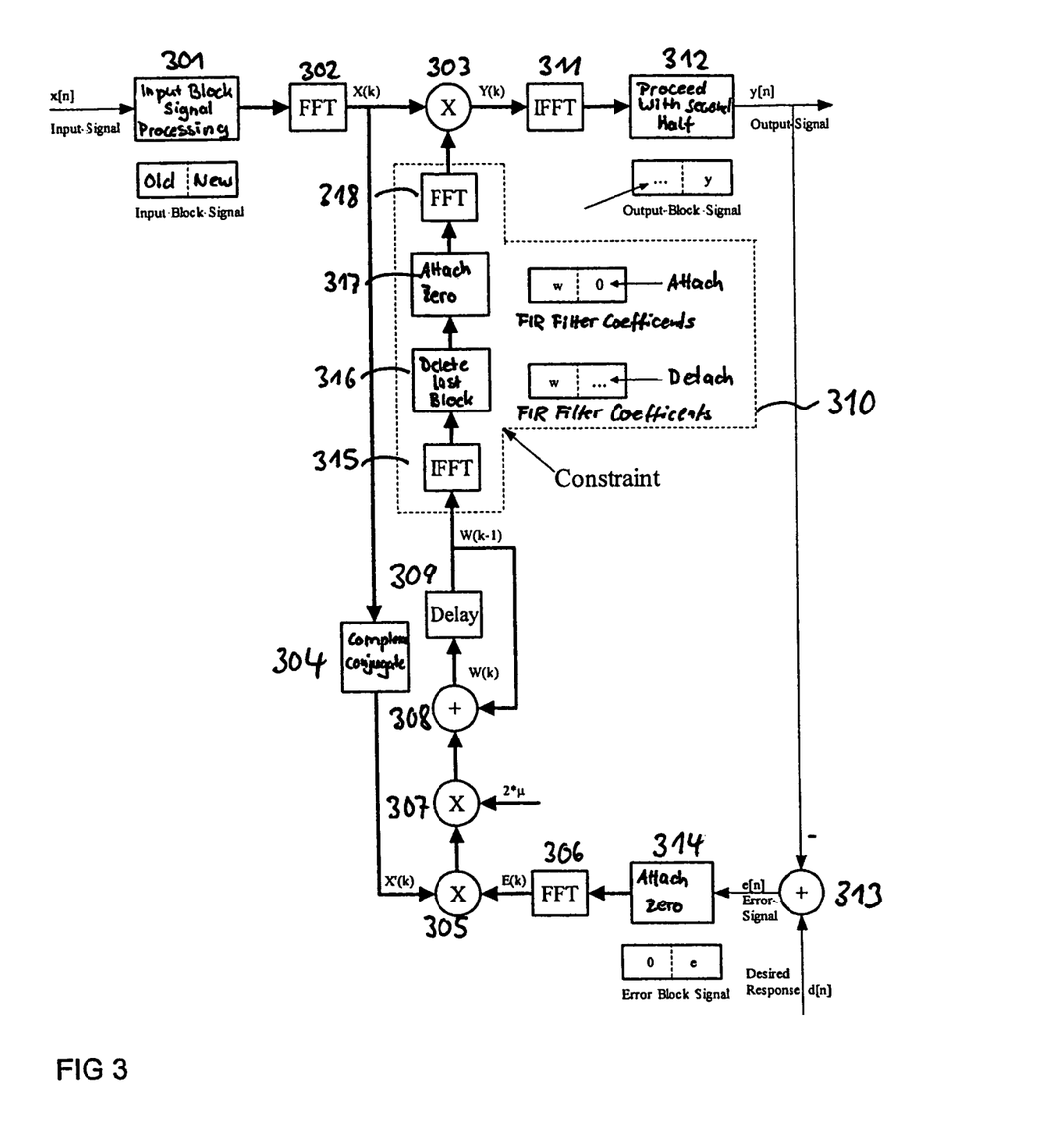
FIG. 3 is a frequency domain adaptive filter for a DEC system.

The overlap save FDAF as shown in FIG. 3 can be implemented both with and without the so-called constraint—i.e., the rectangular windowing of the adaptive filter coefficients in the time domain. Along with considerably less computing time (because 2 FFTs can be omitted), the only other difference is particularly evident in the convergence speed of the two alternative methods. The method with the constraint is adapted significantly faster than the method that does without restrictions on filter coefficients to possibly speed up computing time.

The overlap-safe FDAF comprises an input block processing unit 301 receiving a signal x[n] as an input signal. The input block signal includes an old block and a new block wherein the new block is attached to the old block. The signal output from the input block signal unit 301 is supplied to a Fast Fourier Transformation (FFT) unit 302 that provides a signal X(k) in the frequency domain which corresponds to the input signal x[n] in the time domain. The signal X(k) is supplied to a multiplier 303 and to a complex conjugate processing unit 304, the output signal X'(k) of which is supplied to a multiplier 305. The multiplier 305 also receives a signal E(k) from a FFT-unit 306 and supplies its output signal to a multiplier 307 for multiplying with a constant 2μ. An adder 308 is connected downstream of the multiplier 307, and the adder 308 also receives its own output signal W(k) delayed by a delay unit 309 as a delayed signal W(k−1).

The delayed output signal W(k−1) is supplied to a constraint unit 310 that provides one of the signals supplied to the multiplier 303. The output signal Y(k) is transformed by an inverse Fast Fourier Transformation (FFT) unit 311 into an output signal in the time domain wherein only the second half of the output block signal is used for forming an output signal y[n]. Selecting of the second half of the output block signal is performed in an output block signal unit 312. The output signal y[n] and the desired response signal d[n] are supplied to a subtractor 313 that generates an error signal e[n] therefrom. In a processing unit 314 connected downstream of the subtractor 313 and receiving the error signal e[n], a block containing only zero bits is attached to the error signal forming an error block signal. The error block signal is supplied to the FFT unit 306. The optional constraint unit 310 comprises an inverse Fast Fourier Transformation (IFFT) unit 315, a block delete unit 316 for deleting the last data block, a block attach unit 317 for attaching a block containing only zero bits, and a Fast Fourier Transformation (FFT) unit 318 connected in series between the delay unit 309 and the multiplier 303.

One advantage of an adaptive filter implemented in the spectral domain is that it is markedly more stable than its time domain counterpart—i.e., it cannot be so quickly disturbed, for example, by strong noise signals as only the spectral components of the adaptive filter are affected by noise at the exact location of the noise. If the noise relates, for example, to a speech signal, it usually will not have a broadband spectrum, but mainly includes different narrowband signals, so-called formants. Although the duration of the formants is short, they contain enough energy to usually disturb the adaptive filter at the point they occur—i.e., without any countermeasure.

Spectral domains beside the formants are either not disturbed at all or not so strongly disturbed that the adaptive filter is consistently disturbed—in other words, the approximated model retains its correct functionality for the most part. This circumstance is also the reason why an adaptive adaptation step size might not even be needed in certain cases for adaptive filters implemented in the spectral domain (the adaptive step size is required for a time domain filter). However, if an adaptive adaptation step size is involved and therefore the adaptation for the spectral domains affected by a large noise signal for the duration of the disturbance is omitted, the already approximated model can be broadband protected against destruction by overly large noise factors. However, there may be the risk of complete adaptation blockage—for example, in the event of sudden changes in the room impulse response, which demands suitable countermeasures.

One solution to this problem is the normal or standardized coherence function between the source signal (x[n]) and the microphone signal (d[n]) or between the output signal of the adaptive filter core (y[n]) and the microphone signal (d[n]) in the frequency range. Better results can be obtained, however, by using a second alternative method: the so-called double-talk detector. Ideally, the optimum adaptation step size is obtained from the relationship between the spectral power densities of the residual echo (b[n]) and the error signal (e[n]). In practical terms, however, direct computation is not possible because the required residual echo signal is inaccessible. This signal can nonetheless be estimated. The power spectral density of the residual echo signal can be estimated in a simple manner by filtering the power spectral density of the input signal with the power spectral density of the current echo path model (W(k)). The following equation applies in this respect:

$$u(n, k) = \frac{\Phi_{bb}(n, k)}{\Phi_{ee}(n, k)} = \frac{|W(n, k)|^2 * \Phi_{xx}(n, k)}{\Phi_{ee}(n, k)} \quad \text{(EQ. 1)}$$

Wherein equation 1 is a computation of the adaptive adaptation step size in the spectral domain.

If equation 1 is used to compute the adaptive adaptation step size, it is now possible not only to solve the problem of disturbance of the approximated model due to strong noise signals, but also to remedy the problem of sudden changes in the room impulse response. This can be easily explained using equation 1 as shown above: although the error signal rises in situations with strong noise, the residual echo does not, and consequently the adaptation step size falls. In contrast, in the case of sudden changes of the loudspeaker-room-microphone (LRM) system, both the residual echo and the error signal increase, which means the adaptation step size has a large value, which is necessary for new adaptations.

Whenever music is presented in a noisy environment, the noise is considered a disturbance. In the past measures against noise have been taken. Before DVC a user simply turned up the volume on the sound system as appropriate to counteract the noise. The DVC system then automatically took over doing this task. It was discovered at the time of using the DEC system in the time domain that not only the loudness has to be adapted according to the noise, but also that its spectral coloring through an appropriate equalizing filter should be considered so that most of the original audio characteristic of the music signal is retained. The equalizing filter was automatically set using different types of analysis in the time domain in such a way that it roughly follows the power spectral density (PSD) of the noise signal. Accordingly a system is wanted that is not only able to increase the loudness as required, but also to appropriately counteract the spectral distortion of the music signal as well. A model of the equalizer filter that is based solely on the PSD of the noise signal is not considered suitable as it would ignore the currently available music signal. A better system would appear to be one that produces the equalizer filter using both the noise and music signals.

For a better understanding, the following example is considered: a 1-kHz tone reduced by 12 dB is to be used as a noise signal, and white noise reduced by 20 dB is to serve as the music signal. Neither increasing the loudness of the music signal alone, nor just equalizing with the PSD of the noise signal nor a combination of these two approaches would provide an acceptable solution. The reason for this is to be found in the psycho-acoustics and is referred to as 'masking' (see, for example, Zwicker E., Fastl H., 1998, Psychoacoustics, Facts and Models, Springer Series in Information Sciences, Springer-Verlag, second edition). This term means that human hearing is so affected by narrowband noise signals that not only the band identical to the noise signal, but also adjacent frequency bands are influenced. Consequently, in the above example an equalizer filter with a bandpass characteristic of low quality and a center frequency equal 1 kHz is required. However, the DEC system in the time domain would not provide us with such an equalizing function.

To find an adequate equalizer filter, the masking threshold value of the noise signal has to be evaluated, first. Further, the music signal also has a masking threshold value, which has to be considered in the computation of the equalizer filter because spectral domains in which the music signal masks the noise signal—i.e., renders inaudible, are not permitted to be increased if the original audio characteristic of the music signal is to be retained. More important is the difference between the two masking thresholds as only the spectral domains in which the noise signal masks the music signal are allowed to appear in the equalizer filter.

Figure 4:
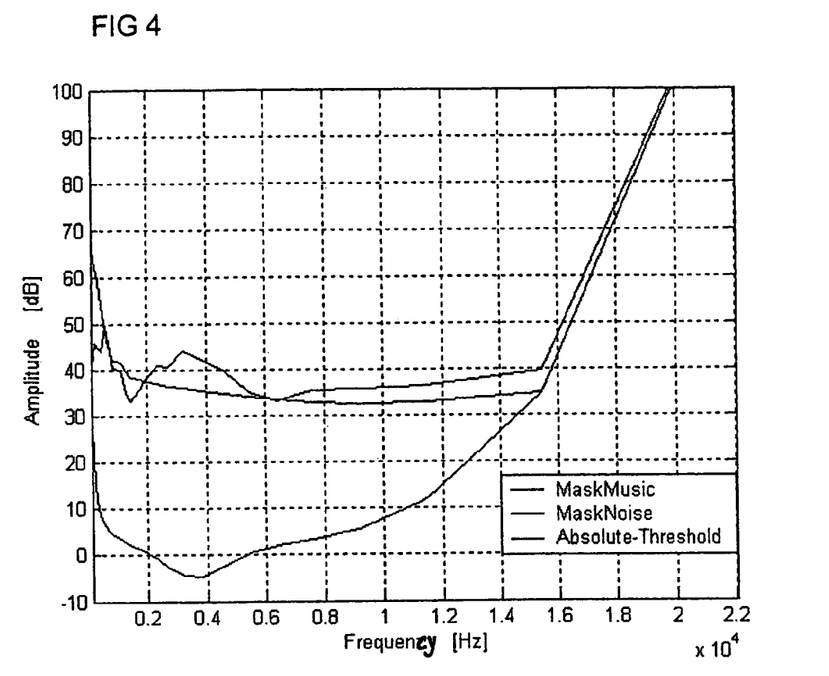
FIG. 4 illustrates the characteristics of masking thresholds compared to an absolute background threshold.

FIG. 4 shows the characteristics of masking thresholds compared to the absolute background threshold. One of the curves depicted in the graph is the masking threshold of a noise signal typically experienced in an automobile, while the other curve shows the masking threshold of a typical music signal. The characteristic of the gain function is computed from the difference between the masking thresholds of the noise and music signals—i.e., the characteristic of the equalizer filter, which is shown below for this example.

Figure 5:
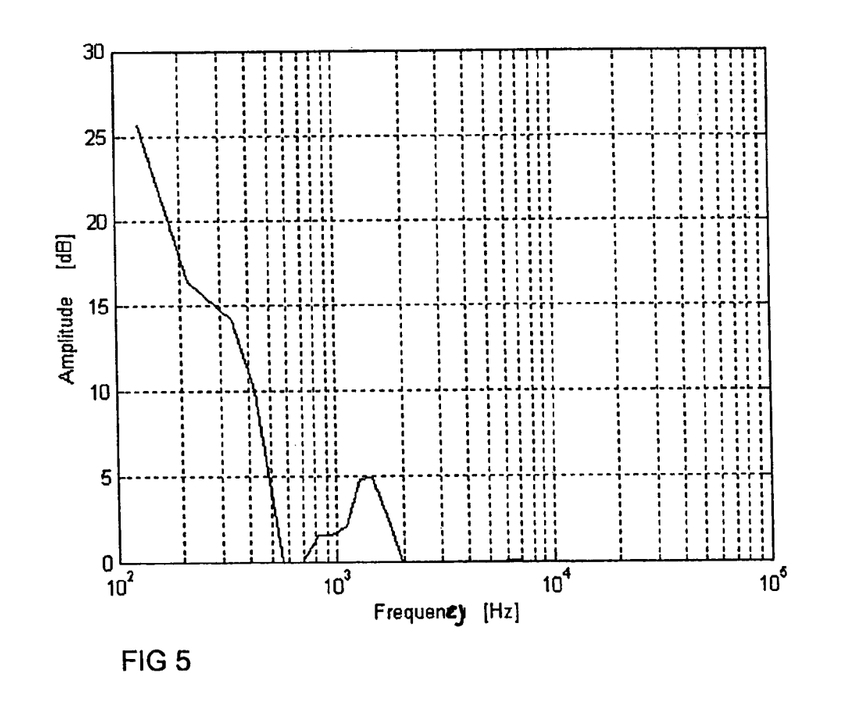
FIG. 5 is a diagram of the gain of a typical equalizer filter in an automobile.

FIG. 5 shows a representation of a typical equalizer filter in an automobile. The disadvantage of this method is that the gain characteristic rises infinitely as soon as the music signal pauses or becomes very quiet. This can be solved by limiting the maximum gain. In addition, increasing the unavailable music signal would admittedly cause an increase in (quantization) noise, but only up to the masking threshold of the noise signal, which would not be noticed in ideal cases since, on the one hand, it would be masked by the noise signal and, on the other hand, would exhibit its spectral form.

A number of masking models are known, two of which have established themselves in practical use. One is the model based on the MPEG format (see, for example, ISO/IEC JTC1/SC29/WG11 MPEG, 1993, IS11172-3, Information technology—Coding of moving pictures and associated audio for digital storage at up to about 1.5 Mbit/s—Part 3: Audio, ISO/IEC), which is also applied in the familiar MP3 music format, while the other is the so-called Johnston model (see, for example, Johnston J. D., 1988, Estimation of Perceptual Entropy Using Noise Masking Criteria, Proc. ICASSP'88, pp. 2524-2527, or Johnston J. D., 1988, Transform Coding of Audio Signals Using Perceptual Noise Criteria. IEEE Journal on Selected Areas in Communications 6, pp. 314.323), which is favored for the present implementation because it is easier to scale. In contrast, the MPEG-based model uses fixed tables available only for a limited number of sampling frequencies. It is sophisticated to modify these tables, for example, to obtain any sampling frequency required. This is a factor that makes the Johnston model preferable.

In practice, the equalizer filter is usually specified for one channel, but is nonetheless used for multiple channels. Therefore, an equalizer filter is needed—both in the frequency and time domains—with different source signals. Filtering in the time domain can be accomplished using an FIR filter computation, or in the spectral domain using fast convolution. Since the equalizer filter is a long filter (due to its broadband nature), a direct implementation in the frequency domain requires too much memory, and a direct implementation in the time domain takes up too much computation time. The former problem can be regarded as the more pressing because equalizer filtering takes place in the spectral domain and therefore requires a large amount of memory.

Thus the long FIR equalizer filter needs to be replaced by a less complex one. Referring to the LPC analysis in the time domain by iteratively computing the LPC coefficients, for example, using the GAL (Gradient Adaptive Lattice) algorithm, and then inserting the computed coefficients in a pure predictor filter (i.e., IIR filter). In this way, the length of the required filters can be reduced without giving rise to grave problems. Below is a schematic representation of how such a computation of the IIR filter coefficients using the GAL algorithm may appear.

Figure 6:
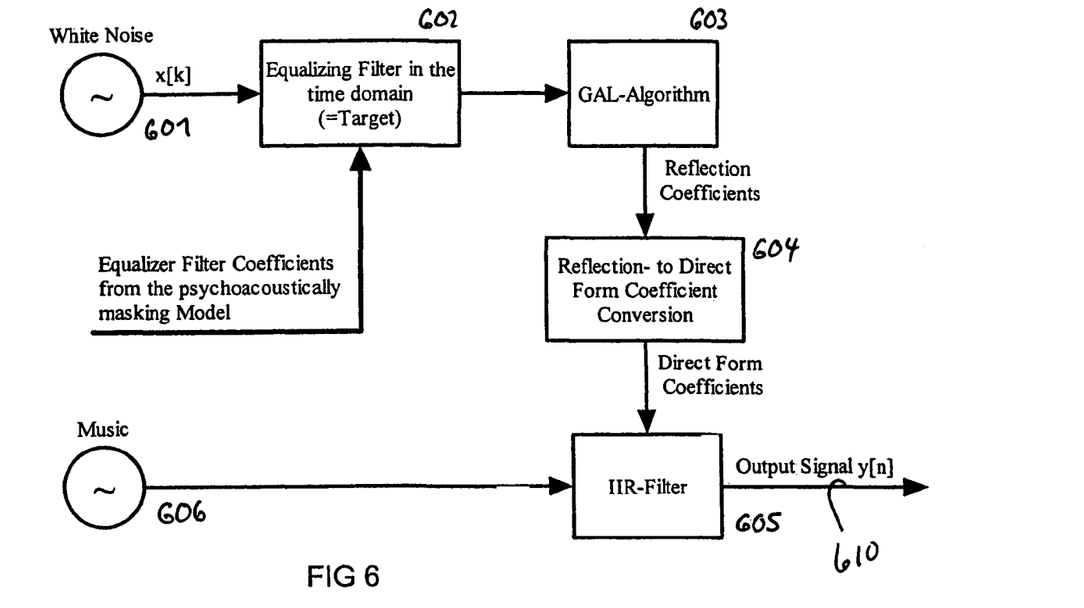
FIG. 6 is a representation of the iterative computation of the IIR filter coefficients using the GAL algorithm.

FIG. 6 is a representation of the iterative computation of the IIR filter coefficients using the GAL algorithm. In FIG. 6, a signal x[k], essentially a white noise signal from a noise source 601 is supplied to an equalizing filter 602 in the time domain. The filter coefficients for the equalizing filter 602 are derived by a psycho-acoustically masking model. The signal output by the equalizing filter 602 is supplied to a GAL-algorithm unit 603. The GAL-algorithm unit 603 provides reflection coefficients that are transformed into direct form coefficients in a conversion unit 604. These direct form coefficients are used as filter coefficients in an IIR-filter 605 which is connected downstream of a desired-signal source 606 and providing an output y[n] on a line 610.

Figure 7:
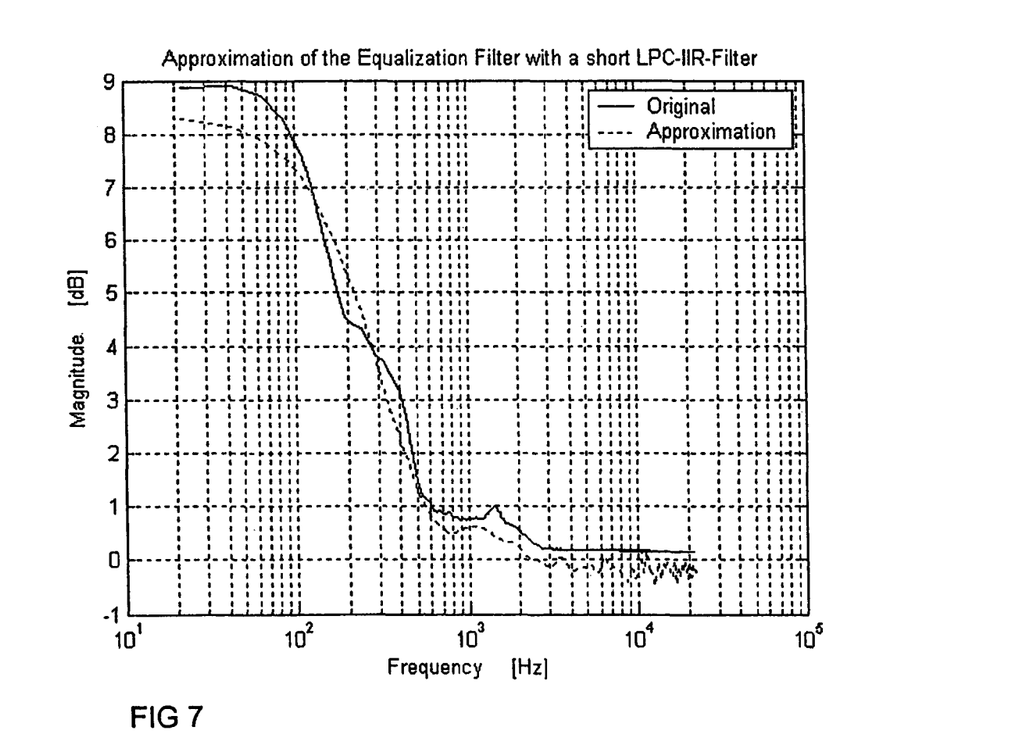
FIG. 7 illustrates the comparison of the original equalizer filter with the approximated equalizer filter.

FIG. 7 illustrates the comparison of the original equalizer filter with the approximated equalizer filter. FIG. 7 shows the gain of an equalizer filter typically found in an automobile. The gain curve referred to as the original represents the gain directly computed from the psychoacoustic model, while the dotted curve (referred to as the approximation) represents the original gain's reproduction using an IIR filter. The original gain curve was generated using a 512-tap FIR filter, the approximation using a 50-tap IIR filter. In view of the fact that the factor is reduced to a tenth, the general shape of the approximated curve matches the original quite well. This proves that the method can be used when there is a shortage of computing time and memory.

Figure 8:
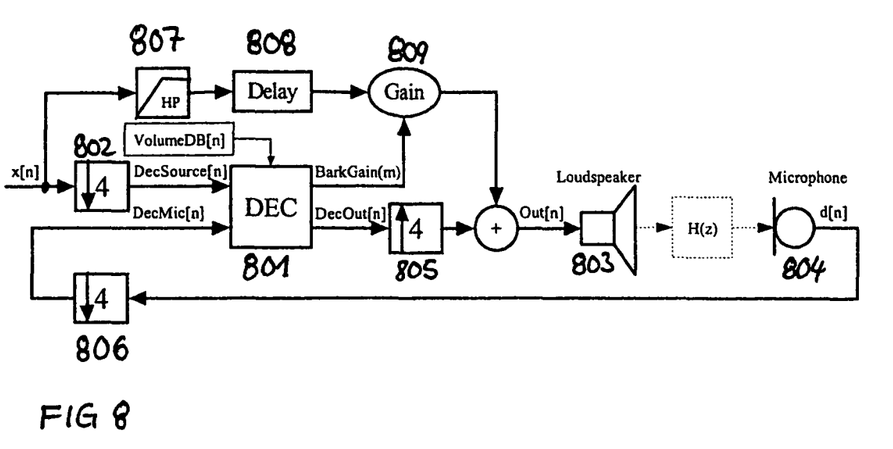
FIG. 8 is an alternative implementation of a DEC system comprising a bypass.

In FIG. 8, a DEC-system 801, which is a similar system to those systems shown in FIGS. 1 and 2, is supplied with a desired signal x[n] via a sampling rate decimeter 802. The output signal of the DEC-system 801 is supplied to a loudspeaker 803 via a sampling rate interpolator 805. The loudspeaker 803 generates an acoustic signal from an output signal OUT[n] and the acoustic signal is transferred to a microphone 804 wherein the transferal can be described by a transfer function H[z]. The signal d[n] from the microphone 804 is supplied via a sampling rate decimeter 806 to the DEC-system 801. The signal x[n] is bypassed in a bypass path comprising highpass filter 807, a delay unit 808, and a controllable gain unit 809. The controllable gain unit 809 is controlled by the DEC-system 801 which internally is controlled by a volume mechanism.

One can see that although an implementation of the DEC system in the spectral domain is more complex than one in the time domain, the processing benefits from greater flexibility and possibilities, which in the final analysis results in higher quality of the system.

The above-mentioned systems may be implemented in microprocessors, signal processors, microcontrollers, computing devices etc. The individual system components are in this case hardware components of the microprocessors, signal processors, microcontrollers, computing devices, etc. which are correspondingly implemented by software.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. An audio enhancement system for compensating for ambient noise in a listening environment, comprising:
    a first circuit for producing a first electrical signal in the time domain and for generating a re-transformed first electrical signal, comprising
        a time-to-frequency transformation unit responsive to the first electrical signal in the time domain for generating a second electrical signal in the frequency domain;
        a multiplier that receives the second electrical signal in the frequency domain and a spectral gain signal in the frequency domain, and provides an equalized signal in the frequency domain; and
        a frequency-to-time transformation unit responsive to the equalized signal in the frequency domain for generating the re-transformed first electrical signal in the time domain;
    at least one loudspeaker responsive to the re-transformed first electrical signal for generating a sound output;
    a sensor for producing a total sound signal representative of a total sound level in the listening environment, where the total sound level comprises both the sound output from the at least one loudspeaker and the ambient noise within the listening environment; and
    a second circuit for extracting an ambient noise signal representative of the ambient noise within the listening environment from the total sound signal, and for providing the spectral gain signal in the frequency domain, comprising
        a noise estimation unit that receives the total sound signal, extracts the ambient noise signal, and generates a third electrical signal;
        a mean value calculation unit that receives the third electrical signal, and provides a fourth electrical signal;
        a voice activity detector that receives the fourth electrical signal, and provides a fifth electrical signal indicative of the ambient noise in the listening environment; and
        a psychoacoustic gain shaping unit that receives the fifth electrical signal and the second electrical signal, and provides the spectral gain signal in the frequency domain to the multiplier of the first circuit.

2. The audio enhancement system of claim 1, where the noise estimation unit of the second circuit is operated in the frequency domain.

3. The audio enhancement system of claim 2, where the noise estimation unit comprises a frequency domain adaptive filter.

4. The audio enhancement system of claim 3, where the frequency domain adaptive filter comprises an overlap-save frequency domain adaptive filter.

5. The audio enhancement system of claim 1, where the noise estimation unit is operated in the time domain.

6. The audio enhancement system of claim 5, where the noise estimation unit operated in the time domain comprises at least one adaptive filter.

7. The audio enhancement system of claim 1, where the second circuit further comprises means for linear predictive coding in the frequency domain.

8. The audio enhancement system of claim 1, where the gain shaping unit performs a psycho-acoustically motivated gain shaping function.

9. The audio enhancement system of claim 8, where the gain shaping unit has a frequency scale according to psycho-acoustic frequency groups.

10. The audio enhancement system of claim 8, where the gain shaping unit has a warped frequency scale.

11. The audio enhancement system of claim 8, where the gain shaping unit performs psycho-acoustic masking.

12. The audio enhancement system of claim 11, where the psycho-acoustic masking is performed in the MPEG format.

13. The audio enhancement system of claim 11, where the psycho-acoustic masking is performed according to the Johnston model.

14. A method for enhancing the sound signal produced by an audio system in a listening environment by compensating for ambient sound in the listening environment, comprising the steps of:
    producing an audio sound signal in the time domain from a first electrical sound signal in the time domain, where the first electrical sound signal in the time domain is transformed into a second electrical sound signal in the frequency domain, where the second electrical sound signal is multiplied by a psychoacoustic spectral gain signal to provide an equalized signal that is retransformed into the time domain to provide the audio sound signal;
    measuring the sound level in the listening environment and generating a time domain total sound signal representative thereof;
    transforming the time domain total sound signal to a frequency domain spectral signal in the frequency domain, processing the frequency domain spectral signal to provide a mean value, voice activity detecting the mean signal to provide a spectral noise signal indicative of the ambient noise in the listening environment, psychoacoustically gain processing the spectral noise signal and the second electrical sound signal to provide the psychoacoustic spectral gain signal.

15. The method of claim 14, where the step of estimating the noise in the listening environment is performed in the frequency domain.

16. The method of claim 15, where the step of estimating the noise in the listening environment comprises adaptive filtering in the frequency domain.

17. The method of claim 16, where the adaptive filtering comprises an overlap-save adaptive filtering in the frequency domain.

18. The method of claim 14, where the step of estimating the noise in the listening environment is performed in the time domain.

19. The method of claim 18, where the step of estimating the noise in the listening environment comprises adaptive filtering in the time domain.

20. The method of claim 14, where the step of processing further comprises the step of linear predictive coding in the frequency domain.

21. The method of claim 14, where the step of processing further comprises psycho-acoustical gain shaping.

22. The method of claim 21, where the psycho-acoustical gain shaping comprises frequency scaling according to psycho-acoustic frequency groups.

23. The method of claim 21, where the psycho-acoustical gain shaping comprises a warped frequency scaling.

24. The method of claim 21, where the psycho-acoustical gain shaping performs psycho-acoustic masking.

25. The method of claim 24, where the psycho-acoustic masking is performed in the MPEG format.

26. The method of claim 25, where the psycho-acoustic masking is performed according to the Johnston model.

27. An audio enhancement system for compensating for ambient noise in a listening environment, comprising:
   a time to frequency domain transformation unit that receives an input signal and provides a frequency domain output signal;
   a multiplier that receives the frequency domain output signal and an equalizing signal and provides a multiplier output signal;
   a frequency to time domain transformation unit that receives the multiplier output signal and provides an equalized signal;
   a loudspeaker that receives the equalized signal and outputs an audio signal indicative thereof to a listening environment;
   a transducer that senses audio within the listening environment and provides a sensed audio signal indicative thereof;
   a time to frequency domain transformation that is responsive to the sensed audio signal and provides a spectral sensed audio signal;
   a circuit that is responsive to the spectral sensed audio signal and the frequency domain output signal and provides the equalizing signal, the circuit comprising a frequency domain mean value calculation unit, a frequency domain voice activity detector and a frequency domain psychoacoustic gain shaping unit.

28. An audio dynamic equalization control system, comprising:
   a first transformation that receives a time domain input signal and transforms the time domain input signal to a frequency domain input signal;
   a multiplier that receives the frequency domain input signal and a spectral gain signal, and provides a product signal indicative of the product thereof;
   a second transformation that receives the product signal and transforms the product signal from the frequency domain, and provides a time domain output signal indicative thereof;
   a loudspeaker that receives the time domain output signal and provides audio indicative thereof;
   a microphone that senses sound in the motor vehicle passenger cabin, and provides a sensed signal indicative thereof;
   a third transform that receives the sensed signal and transforms the sensed signal from the time domain to the frequency domain, and provides a frequency domain sensed signal indicative thereof; and
   a circuit, responsive to the frequency domain sensed signal and the frequency domain input signal, that computes and provides the frequency domain spectral gain signal, the circuit comprising a frequency domain mean value calculation unit, a frequency domain voice activity detector and a frequency domain psychoacoustic gain shaping unit.

29. An audio dynamic equalization control system, comprising:
   a first transformation that receives a time domain input signal and transforms the time domain input signal to a frequency domain input signal;
   a multiplier that receives the frequency domain input signal and a frequency domain spectral gain signal, and provides a product signal indicative of the product thereof;
   a second transformation that receives the product signal and transforms the product signal from the frequency domain, and provides a time domain output signal indicative thereof;
   a loudspeaker that receives the time domain output signal and provides audio indicative thereof;
   a microphone that senses sound in the motor vehicle passenger cabin, and provides a sensed signal indicative thereof;
   a third transform that receives an estimated noise signal and transforms the estimated noise signal from the frequency domain to the time domain, and provides a time domain noise signal indicative thereof;
   a summer that receives the sensed signal and the time domain noise signal, and provides a difference signal indicative of the difference between the sensed signal and the time domain noise signal;
   a fourth transform that receives the difference signal and transforms the difference signal from the time domain to the frequency domain, and provides a frequency domain difference signal indicative thereof;
   a noise estimation filter that receives the frequency domain input signal and the frequency domain difference signal, and provides the estimated noise signal; and
   a circuit that is responsive to the frequency domain difference signal and the frequency domain input signal and computes the frequency domain spectral gain signal, comprising a frequency domain mean value calculation unit, a frequency domain voice activity detector and a frequency domain psychoacoustic gain shaping unit.

30. An audio dynamic equalizer control system, comprising:
   a first transformation that receives a time domain input signal and provides a frequency domain input signal;
   a multiplier that receives the frequency domain input signal and a spectral gain signal and provides a multiplied signal indicative of the product thereof;

a second transformation that receives the multiplied signal and transforms the received multiplied signal to the time domain to provide a time domain output signal;

a loudspeaker that receives the time domain output signal and provides an audio output indicative thereof;

a microphone that senses the audio in a motor vehicle cabin and provides a sensed signal indicative thereof;

a third transformation that receives the sensed signal and transforms the sensed signal to the frequency domain and provides a frequency domain sensed signal indicative thereof; and a circuit that is responsive to the frequency domain sensed signal and the frequency domain input signal and provides the spectral gain signal in the frequency domain, the circuit comprising a cascaded frequency domain mean value calculation unit, a frequency domain voice activity detector and a frequency domain psychoacoustic gain shaping unit that provides the spectral gain signal.

31. An audio dynamic equalizer control system, comprising:

a first time domain to frequency domain transformation that receives an audio input signal and provides a first frequency domain audio output signal;

a multiplier that receives the frequency domain output signal and spectral gain factors, and provides a multiplier output signal;

a first frequency domain to time domain transformation that receives the multiplier output signal and provides a time domain output signal;

a loudspeaker that receives the time domain output signal and outputs an audio signal indicative thereof;

a microphone that senses audio in a motor vehicle cabin and provides a sensed signal indicative thereof;

an adaptive filter that receives and filters the frequency domain audio output signal to provide an adaptive filter output signal;

a second frequency domain to time domain transformation that receives the adaptive filter output signal and provides a time domain adaptive filter output signal;

a summer that receives the sensed signal and the time domain adaptive filter output signal and provides a difference signal indicative of the difference thereof;

a second time domain to frequency domain transformation that receives the difference signal and provides a second frequency domain audio output signal; and a circuit that is responsive to the first and second frequency domain audio output signals and computes the spectral gain factors, the circuit comprising a frequency domain mean value calculation unit, a frequency domain voice activity detector and a frequency domain psychoacoustic gain shaping unit.

32. The audio enhancement system of claim 1, where the voice activity detector suppresses spectral voice signal components in the fourth electrical signal to provide the fifth electrical signal.

33. The audio enhancement system of claim 32, where the gain shaping unit receives the first electrical signal, and generates the spectral gain signal as a function of the fifth electrical signal and the second electrical signal.

* * * * *

UNITED STATES PATENT AND TRADEMARK OFFICE
CERTIFICATE OF CORRECTION

| | | |
|---|---|---|
| PATENT NO. | : 8,571,855 B2 | Page 1 of 1 |
| APPLICATION NO. | : 11/185534 | |
| DATED | : October 29, 2013 | |
| INVENTOR(S) | : Markus Christoph | |

It is certified that error appears in the above-identified patent and that said Letters Patent is hereby corrected as shown below:

In the Specification

Column 4
Line 51, please delete "ac oustic" and insert -- acoustic --

Signed and Sealed this
Twenty-fourth Day of December, 2013

Margaret A. Focarino
*Commissioner for Patents of the United States Patent and Trademark Office*